April 20, 1965 F. P. MARCELIS 3,179,543
METHOD OF MANUFACTURING PLATES HAVING FUNNEL-SHAPED
CAVITIES OR PERFORATIONS OBTAINED BY ETCHING
Filed March 9, 1962

INVENTOR
FLORES P. MARCELIS
BY Frank R. Jifani
AGENT

United States Patent Office 3,179,543

Patented Apr. 20, 1965

3,179,543

METHOD OF MANUFACTURING PLATES HAVING FUNNEL-SHAPED CAVITIES OR PERFORATIONS OBTAINED BY ETCHING

Flores Pieter Marcelis, Oliemolenstraat, Drachten, Netherlands, assignor to North American Philips Company, Inc., New York, N.Y., a corporation of Delaware Filed Mar. 9, 1962, Ser. No. 178,771
Claims priority, application Netherlands Mar. 30, 1961
4 Claims. (Cl. 156—11)

The invention relates to methods of manufacturing plates having one or more funnel-shaped cavities or perforations, wherein the plate is covered with an etching resist which, on one side of the plate, which at the area of a cavity or perforation to be formed, is provided with a corresponding aperture, whereupon the plate is subjected to an etching treatment.

For decorative and other reasons it is frequently desirable for cavities provided by etching in a plate or, if the plate has been etched through, for perforations to be funnel-shaped to a greater or lesser extent, that is to say that the wall of a cavity or perforation is on the average at a distinct angle to the direction of the thickness of the plate.

In known etching methods of obtaining such funnel-shaped cavities or perforations, the etching process, when starting from one side of the plate, is effected in several sequential phases, the aperture in the etching resist being enlarged during the intervals between the phases. This may be effected, for example, by replacing the etching resist protecting the material of the plate during the etching phase just terminated by a wholly new etching resist having apertures of larger diameter. Instead of using this fairly complicated method, it has been suggested to use a type of etching resist which may readily be stripped from the plate and to cut loose and pull off the plate in each case a portion of the etching resist circularly surrounding the aperture, so that the sequential etching phases in each case takes place with a large aperture in the etching resist. True, this etching method is, as a whole, less laborious and time-consuming than the first-mentioned, but this is offset by the fact that the etching resist in the desired pattern cannot be obtained by photographic means, while removing in each case only a strip of etching resist requires very accurate work if the dimensions are small.

An object of the invention is to provide a method in which, in contrast to known methods, a pattern of the etching resist need not be modified between the etching phases and the etching process can therefore take place continuously.

According to the invention, a method of the kind mentioned in the preamble is characterized in that the etching resist is provided around the aperture corresponding to a cavity or a perforation to be etched with at least one comparatively narrow slot-like opening extending in parallel to the edge of the aperture, a strip of etching reserve having a width less than twice the thickness of the plate being provided between the edge of the said aperture and the said opening or between sequential slot-like openings surrounding the same aperture with different spacings, the method being such that upon etching the plate to the desired depth of the cavity or to the desired free aperture of the perforation, first separate etched cavities occur below the said aperture and the slot-like opening or openings surrounding it, the cavity below the opening or the cavities below the openings having a depth smaller than that of the etched cavity below the aperture, which etched cavities are united into a single cavity through underetching of the etching resist upon continuation of the etching process.

The method according to the invention is especially suitable for obtaining funnel-shaped perforations in a cutting plate for a dry-shaver. If such a cutting plate is mounted so that the knife-blade contacts that side of the plate where the perforations have their smallest diameters, that is to say, their free apertures, the larger diameters of the perforations on the other side of the plate are favourable for introducting the hairs to be cut into the apertures. In one advantageous embodiment of the method according to the invention applied to the manufacture of a perforated cutting plate for a dry-shaver, a metal foil about 50 microns thick is provided with an etching resist having a regular pattern of apertures of a smallest diameter of about 600 microns on one side of the foil, which apertures are surrounded by slot-like openings in the resist, each about 40 microns wide, the strip of etching which remains between an aperture and the slot-like opening running parallel to it's resist likewise having a width of about 40 microns.

In a method according to the invention, the etching resist pattern discloses one or more slot-like openings running parallel to the edge of an aperture corresponding to a cavity or perforation to be etched in the metal plate and is preferably provided by photographic means. Preferably a photo-resist layer is employed consisting of polyvinyl butyral sensitized, for example, with ammonium bichromate.

In order that the invention may be readily carried into effect, it will now be described, by way of example, with reference to the accompanying drawing, showing one embodiment relating to the manufacture of a cutting plate for a dry-shaver. The figures show different stages of the treatment of a metal foil.

FIGURE 3 shortly after the beginning of the etching process and FIGURE 4 at a later stage;

Figure 1:
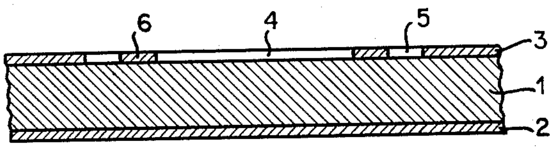
FIGURE 1 is a sectional view, taken along the line I—I in FIGURE 2, of a portion of the foil with the etching resist provided thereon.
Figure 2:
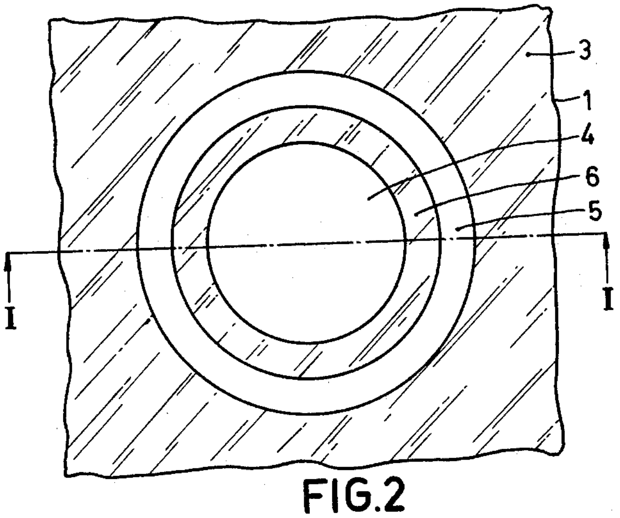
FIGURE 2 is an elevational view of the portion of the foil shown in FIGURE 1.

It is to be noted that the figures are not shown to scale. For several embodiments suitable numerical values will be given hereinafter.

In the illustrated embodiment of the method according to the invention, a plurality of perforated cutting plates for dry-shavers are manufactured from a metal foil band 1 about 50 microns thick, which consists, for example, of rolled spring steel. To this end, the band is covered on each side with etching resist. The etching resist is provided in the form of a continuous layer 2 on one side i.e., on the underside in FIGURES 1, 3, 4 and 5, while on the other side, that is to say on the upper side in the said figures, the etching resist constitutes a layer 3 having apertures 4 at a certain number of areas and having, in each case, a comparatively narrow slot-like opening 5 running parallel to the aperture 4. The apertures 4 are of a circular shape in the example given and have a diameter of about 600 microns. The apertures are provided in a regular pattern, for example at the node points of a square grid pattern having a grid pitch of from 1,000 to 1,400 microns. The slot-like openings 5 surrounding each aperture 4 have a width of about 400 microns and the strip of etching rest 6 which exists between an aperture 4 and its surrounding opening 5 likewise has a width of about 40 microns. The illustrated pattern of the etching resist layer 3 on the upper side of the metal foil band 1 may be obtained by photographic means. To this end first a continuous layer of photo-etching resist is provided on this side of the band 1 and subsequently exposed in the negative of the pattern of the desired apertures 4 and 5, for example through a photographic negative, all the parts of the layer, except those corresponding to the apertures and slot-like openings to be formed, thus being exposed. Due to the hardening effect by the action of the light and after the subsequent treatment of the layer with a solvent for the nonhardened parts, the so-called developing process, the etching resist layer 3 with the apertures 4 and the openings 5 now remain on the upper side of the foil 1. In this photographic formation of the etching resist 3 use is preferably made of a photo-etching resist layer consisting substantially of water-unsoluble polyvinylbutyral having a butyral content of at least 50%, which has been sensitize with ammonium bichromate, the developing process taking place with the aid of, for example, ethonol. The resulting etching resist layer 3 adheres very satisfactorily to the foil 1.

The etching resist layer 2 on the lower side of the strip 1 may consist of a material similar to that of the layer 3. The layer 2 is exposed throughout its surface as no apertures have to be formed in it. The layer 2 may alternatively be obtained by providing on this side of the foil a non-photosensitive covering layer of an etching-resistant and satisfactorily adhering lacquer, for example a nitro-lacquer.

After provision of the layers 2 and 3, the band 1 is introduced into an etching bath and etched therein. By suitable choice of the composition of the bath, the etching process may be effected by chemical means, for example in a ferrichloride solution having a specific gravity of 1.35. However, as an alternative, the etching process may be effected electro-chemically, for which purpose the foil 1 is connected as an anode and passed, for example, through a saturated solution of sodium chloride. As a matter of fact, it is possible to combine the two etching methods, for example by first using a chemical etching process and then a electrolytic etching process. Instead of introducing the foil band 1 covered with etching resist into an etching bath, it is possible to arrange the band in a more or less vertical position and spray the etching liquid, for example the aforementioned ferrichloride solution, against that side of the band that is provided with the etching resist layer 3.

Figure 3:
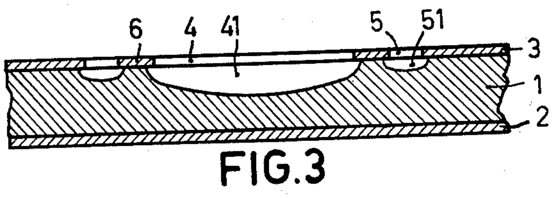
FIGURE 3 and 4 are cross-sectional views, similar to that of FIGURE 1, of intermediate stages of the foil during etching.
Figure 4:
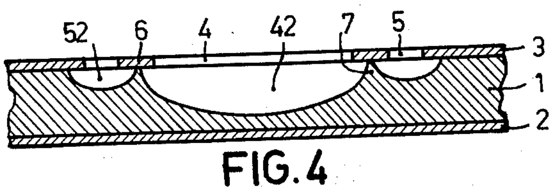
Figure 5:
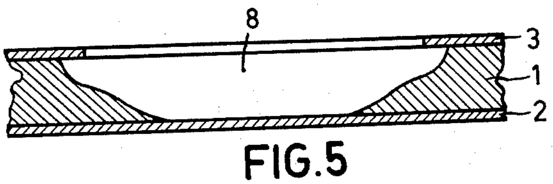
FIGURE 5 shows a similar cross-section at the end of the etching treament.

In the etching process first separate cavities 41 and 51 are produced in the band 1 below the apertures 4 and the slot-like openings 5 respectively which, due to underetching extend slightly underneath the edges of the apertures and openings in the resist layer 3 (FIGURE 3). Since the openings 5 have a comparatively small width, the etching liquid and below these openings is refreshed less readily than in and below the comparatively much wider apertures 4, so that the cavities 51 have a depth smaller than that of the cavities 41. Upon continuation of the etching process the situation shown in FIGURE 4 is reached, in which cavities 42 and 52 respectively below the apertures 4 and the openings 5 respectively, which now show a difference in depth which is even more distinct, are still slightly separated from one another below the intermediate etching-reserve strip 6 by means of a tapered wall 7 which has remained from the material of the band 1. As the etching process is continued further, the intermediate wall 7 is completely etched away, whereby the ring 6 of etching resist comes loose in the bath. The band 1 is etched-through below the apertures 4, resulting in perforations 8 (FIGURE 5) which have their smallest diameters (free apertures) on the side of the etching resist layer 2. The etching treatment is terminated when the free apertures of the perforations 8 substantially correspond to the diameters of the initial apertures 4 in the layer 3.

The etching process is followed in the usual manner by rinsing the etched foil and removing the etching resist on each side thereof with the aid of a solvent, for example a mixture of ethanol and hydrochloric acid, if the layers 2 and 3 were formed of polyvinyl-butyral.

The foil band 1 now perforated is cut to congruent sections each having a determined length and being provided with a number of perforations 8 arranged in the same pattern. Each of the sections obtained by cutting up the band 1 constitutes a cutting plate for a dry-shaver, the blade rotating along that side of the plate where the diameters of the perforations 8 are smallest. Due to the perforations 8 being more or less funnel-shaped toward this side, it is possible to push the skin somewhat into the wider apertures and cut off the hairs close to the skin when using a dry-shaver comprising a cutting plate.

In the example described, the apertures 4 in the etching resist layer 3 are of circular shape. It is frequently more favorable to make the apertures of an elongated shape, for example with a width of about 600 microns, that is to say equal to the diameter of the described circular apertures 4 and with a length from 1200 to 2000 microns. The slot-like openings then provided in the etching rest around these elongated apertures and the intermediate etching resist strips are chosen of the same width as in the example described above.

Instead of using a single slot-like opening around and parallel to the edge of an aperture 4 corresponding to the free aperture of a perforation to be formed, a plurality of concentrically arranged slot-like openings may be provided to surround an aperture at different distances from the edge thereof. In this case both the slot-like openings and an intermediate etching-resist strip are chosen of a width which is smaller since their distance to the edge of the central aperture is larger. It is thus ensured that etching away the material of the band from below an opening located farther from the central aperture can take place less readily and hence the etching depth at this area is smaller than that closer to the aperture. It is thus possible to obtain perforations having a wall ascending in a somewhat stepwise manner and to realize a comparatively large difference in the diameter a perforation on one side and on the other side of the band 1.

In the example described, the slot-like opening 5 surrounding the central aperture 4 is continuous so that a ring 6 of etching resist is present which loosens during etching. However, it is not necessary for the opening 5 to be continuous and one or more narrow connecting strips of etching resist may be present between the ring 6 and the etching resist further away from the aperture 4. These connecting strips may be so narrow, for example approximately as narrow as the ring 6 or even narrower that the material of the band 1 below these connecting strips is also etched away through underetching and the ultimate result is the same as that illustrated in FIGURE 5. It is also possible to choose such connecting strips of a greater width so that at these areas the wall of the performation formed in etching is not so funnel-shaped as at the other areas. This is permissible without objection, for example, at the ends of the elongated perforations described hereinbefore, obtained by means of an elongated shape of the apertures 4.

What is claimed is:

1. A method of making apertures through a plate comprising covering the underside of said plate with a continuous etching resist and covering the upper side of said plate with an upper etching resist having a plurality of holes above the area on said plate where said apertures are to be made therethrough, providing slit-like openings on said resist around said holes and each being spaced from said holes by an etching resist strip having a width smaller than twice the thickness of the portion of said plate between the edge of said hole and said slit-like opening, etching said area of said plate below said holes and etching the area below said slit-like openings, said etched area below said slit-like openings having a depth smaller than the depth of the etched area below said holes and being separate therefrom, and further etching the area of said plate directly under said etching resist strip whereby the latter is subsequently detached from said upper etching resist and said etched areas are united to form a funnel-shaped single aperture.

2. A method of making apertures through a plate having a thickness of about 50 microns comprising covering the underside of said plate with a continuous etching resist and covering the upper side of said plate with an upper etching resist having a plurality of holes above the area on said plate where said apertures are to be made therethrough, each having a diameter of at least 600 microns, providing slit-like openings on said resist around said holes each having a width of approximately 40 microns and spaced from said holes by an etching resist strip having a width of about 40 microns, etching said area of said plate below said holes and etching the area below said slit-like opening, said etched area below said slit-like openings having a depth smaller than the depth of the etched area below said holes and being separate therefrom, and further etching the area of said plate directly under said etching resist strip whereby the latter is subsequently detached from said upper etching resist and said etched areas are united to form a funnel-shaped single aperture.

3. A method of making apertures through a plate comprising covering the underside of said plate with a continuous etching resist and covering the upper side of said plate with an upper etching resist having a plurality of holes above the area on said plate where said apertures are to be made therethrough, said continuous etching resist being constituted of a polyvinyl butyral sensitized with a bichromate, providing on said resist around said holes a slit-like opening spaced therefrom by an etching resist strip having a width smaller than twice the thickness of the portion of said plate between the edge of said hole and said slit-like opening, etching said area of said plate below said holes and etching the area below said slit-like opening, said etched area below said slit-like openings having a depth smaller than the depth of the etched area below said holes and being separate therefrom, and further etching the area of said plate directly under said etching resist strip whereby the latter is subsequently detached from said upper etching resist and said etched areas are united to form a funnel-shaped single aperture.

4. A method of making apertures through a plate as claimed in claim 1 wherein each of the holes in said etching resist are of elongated shape and have a width of approximately 600 microns and a length of from 1200 to 1800 microns.

References Cited by the Examiner

FOREIGN PATENTS

| | | |
|---|---|---|
| 507,854 | 6/39 | Great Britain. |
| 845,832 | 8/60 | Great Britain. |

EARL M. BERGERT, *Primary Examiner.*

JACOB STEINBERG, *Examiner.*